US009018752B2

United States Patent
Kim et al.

(10) Patent No.: US 9,018,752 B2
(45) Date of Patent: Apr. 28, 2015

(54) CIRCUIT BOARDS, METHODS OF FABRICATING THE SAME, AND SEMICONDUCTOR PACKAGES INCLUDING THE CIRCUIT BOARDS

(71) Applicant: Electronics and Telecommunications Research Institute, Daejeon (KR)

(72) Inventors: Ji Eun Kim, Daejeon (KR); Yong Ki Son, Daejeon (KR); Baesun Kim, Daejeon (KR); Il Yeon Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 121 days.

(21) Appl. No.: 13/788,494

(22) Filed: Mar. 7, 2013

(65) Prior Publication Data

US 2014/0097525 A1  Apr. 10, 2014

(30) Foreign Application Priority Data

Oct. 5, 2012 (KR) .................. 10-2012-0110760

(51) Int. Cl.
*H01L 23/12* (2006.01)
*H01L 21/4763* (2006.01)
*H05K 1/03* (2006.01)
(Continued)

(52) U.S. Cl.
CPC ........ *H05K 1/0313* (2013.01); *H01L 23/49572* (2013.01); *H05K 1/115* (2013.01); *H05K 3/0094* (2013.01); *H01L 23/49816* (2013.01); *H01L 24/81* (2013.01); *H01L 23/481* (2013.01); *H01L 23/5226* (2013.01); *H01L 23/49838* (2013.01); *H01L 23/145* (2013.01); *H01L 23/49822* (2013.01); *H01L 23/4985* (2013.01); *H01L 2224/16225* (2013.01); *H01L 2224/81192* (2013.01); *H05K 3/4635* (2013.01)

(58) Field of Classification Search
CPC ............... H01L 23/49838; H01L 23/5226; H01L 24/16; H01L 23/53295; H01L 24/82; H01L 21/02063; H01L 21/486; H01L 23/49816; H01L 24/81; H01L 24/14; H01L 23/145; H01L 23/49822; H01L 23/481; H05K 1/115
See application file for complete search history.

(56) References Cited

U.S. PATENT DOCUMENTS 7,553,738 B2 *   6/2009   Min et al. .................. 438/399
2008/0137263 A1 *   6/2008   Min et al. .................. 361/311

(Continued)

FOREIGN PATENT DOCUMENTS

| KR | 102010009815 A | 9/2010 |
|---|---|---|
| KR | 10-2012-0113668 A | 10/2012 |
| KR | 10-1199483 B1 | 11/2012 |
| KR | 102013003684 A | 4/2013 |
| KR | 102013013452 A | 12/2013 |

*Primary Examiner* — Alonzo Chambliss
(74) *Attorney, Agent, or Firm* — Rabin & Berdo, P.C.

(57) ABSTRACT

Provided is a circuit board, which may include a base layer, an adhesive film, a conductive circuit, and a through via. The adhesive film and the conductive circuit may be provided in plurality to be alternately stacked on the base layer. The through via may be formed through soldering. Since the base layer is not damaged during the soldering, the through via may include various conductive materials. The through via makes it possible to easily connect the conductive circuits having different functions to one another. Accordingly, the circuit board may have multi functions. Thicknesses of the conductive circuits may be adjusted to protect the conductive circuits from folding or bending of the base layer. The circuit board having a multi-layered structure can function not only as a fabric or clothes but also as an electronic circuit.

20 Claims, 6 Drawing Sheets (51) Int. Cl.
*H01L 23/495* (2006.01)
*H05K 1/11* (2006.01)
*H05K 3/00* (2006.01)
*H01L 23/48* (2006.01)
*H01L 23/522* (2006.01)
*H01L 23/14* (2006.01)
*H05K 3/46* (2006.01)
*H01L 23/498* (2006.01)
*H01L 23/00* (2006.01)

(56) References Cited

U.S. PATENT DOCUMENTS

| | | |
|---|---|---|
| 2008/0164562 A1* | 7/2008 | Wang et al. .................. 257/528 |
| 2013/0087369 A1 | 4/2013 | Kim et al. |
| 2013/0319730 A1 | 12/2013 | Son et al. |
| 2014/0319678 A1* | 10/2014 | Pagaila et al. ................ 257/737 |

* cited by examiner

CIRCUIT BOARDS, METHODS OF FABRICATING THE SAME, AND SEMICONDUCTOR PACKAGES INCLUDING THE CIRCUIT BOARDS

CROSS-REFERENCE TO RELATED APPLICATIONS

This U.S. non-provisional patent application claims priority under 35 U.S.C. §119 of Korean Patent Application No. 10-2012-0110760, filed on Oct. 5, 2012, the entire contents of which are hereby incorporated by reference.

BACKGROUND OF THE INVENTION

The present invention disclosed herein relates to a circuit board, a method of fabricating the circuit board, and a semiconductor package including the circuit board, and more particularly, to a circuit board having a multi-layered structure, a method of fabricating the circuit board, and a semiconductor package including the circuit board.

As computing technologies are developed, the performance and function of portable devices are rapidly developed. Since the ubiquitous computing concept has been founded, the use of ubiquitous computing environments is being studied. Along with this trend, the significance of personal portable devices is increasing. To use ubiquitous computing environments, personal digital devices such as mobile phones or smart phones may be applied to everyday goods such as clothes, watches, and necklaces. Specifically, research is carried out to apply a typical electronic device (part) formed of a rigid material to a fabric or clothes and mount the typical electronic device thereon. However, such research is still at an early stage. Unlike typical electronic devices, electronic circuits formed on a fabric are required to satisfy various conditions such as bending and extension to allow activities of a user.

SUMMARY OF THE INVENTION

The present invention provides a flexible circuit board having a multi-layered structure.

The present invention also provides a method of fabricating an electronic circuit, which simplifies a fabrication process.

The present invention also provides a semiconductor package including a flexible circuit board having a multi-layered structure.

Embodiments of the present invention provide circuit boards including: a first adhesive film on a base layer; a first conductive circuit on the first adhesive film; a second adhesive film and a second conductive circuit, which are sequentially stacked on the first conductive circuit; and a through via passing through the second adhesive film and the second conductive circuit and spaced apart from the base layer.

In some embodiments, the base layer may include a polymer material or a fabric.

In other embodiments, the second conductive circuit may include a first surface oriented to the base layer and a second surface opposed to the first surface, and the first surface is rougher than the second surface.

In still other embodiments, the circuit boards may further include: a third adhesive film on the second conductive circuit; a third conductive circuit on the third adhesive film; and an external connection terminal on the third conductive circuit.

In even other embodiments, the circuit boards may further include: a pad on the second conductive circuit; and a solder ball on the pad.

In yet other embodiments, the first adhesive film may include an acrylic-based material, a urethane-based material, a polyester-based material, or a polyimide varnish-based material, and wherein the base layer may include a polymer material based on the same material as that of the first adhesive film.

In other embodiments of the present invention, methods of fabricating a circuit board include: providing a first adhesive film and a first conductive circuit, which are sequentially stacked on a protective film and have a through hole; transferring the first adhesive film and the first conductive circuit onto a base layer to sequentially stack the first adhesive film and the first conductive circuit thereon; and forming a through via filling the through hole.

In some embodiments, the providing of the first adhesive film and the first conductive circuit may include: sequentially forming the first adhesive film and a conductive film on the protective film; patterning the conductive film to form the first conductive circuit; forming the through hole passing through the protective film, the first adhesive film, and the first conductive circuit; and exposing the first adhesive film by forming a carrier film on the first conductive circuit and removing the protective film.

In other embodiments, the forming of the through via may include removing the carrier film to expose the through hole and then filling the through hole.

In still other embodiments, the methods may further include: sequentially forming a third adhesive film and a third conductive circuit on the first conductive circuit; and forming a pad and a solder ball on the third conductive circuit.

In even other embodiments, the base layer may further include a second adhesive film and a second conductive circuit which are sequentially formed on the base layer.

In yet other embodiments, the forming of the through via may include filling the through hole with a conductive material or performing soldering thereon.

In further embodiments, the methods may further include, after the forming of the through via, forming a pad or a solder ball on the first conductive circuit to electrically connect the first and second conductive circuits to an external device.

In still further embodiments, the sequentially stacking of the first adhesive film and the first conductive circuit may include disposing the first adhesive film to be oriented to the base layer and hot-pressing the first adhesive film.

In even further embodiments, the base layer may include a polymer material or a fabric.

In still other embodiments of the present invention, semiconductor packages include: a base layer; a first adhesive film and a first conductive circuit, which are stacked on the base layer; a second adhesive film and a second conductive circuit, which are stacked on the first conductive circuit; a through via passing through the second adhesive film and the second conductive circuit; an external connection terminal on the second conductive circuit; and an electronic device mounted on the second conductive circuit.

In some embodiments, the adhesive film may include an insulating material and prevent short circuiting between the conductive circuits.

In other embodiments, the base layer may include a polymer material or a fabric.

In still other embodiments, the semiconductor packages may further include a third adhesive film and a third conductive circuit, which are stacked between the second conductive circuit and the external connection terminal.

In even other embodiments, the through via may be disposed out of the first adhesive film.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Exemplified embodiments of the present invention will now be described with reference to the accompanying drawings. The present invention may, however, be embodied in different forms and should not be construed as limited to the embodiments set forth herein. The embodiments below do not limit the scope of the present invention and are provided to fully explain the present invention to those skilled in the art. Those skilled in the art would understand that the concept of the present invention can be embodied under a certain appropriate condition.

In the following description, the technical terms are used only for explaining a specific exemplary embodiment while not limiting the present invention. The terms of a singular form may include plural forms unless referred to the contrary. The meaning of 'comprises' and/or 'comprising' specifies a property, a region, a fixed number, a step, a process, an element and/or a component, but does not exclude other properties, regions, fixed numbers, steps, processes, elements and/or components.

In the specification, it will be understood that when a layer (or film) is referred to as being 'on' another layer or substrate, it can be directly on the other layer or substrate, or intervening layers may also be present.

Also, though terms like a first, a second, and a third are used to describe various regions and layers (or films) in various embodiments of the present invention, the regions and the layers are not limited to these terms. These terms are used only to discriminate one region or layer (or film) from another region or layer (of film). Thus, a layer referred to as a first layer in one embodiment can be referred to as a second layer in another embodiment. An embodiment described and exemplified herein includes a complementary embodiment thereof. Like reference numerals denote like elements throughout.

Unless otherwise defined herein, terms used in embodiments of the present invention shall have the same meanings as those well known to those skilled in the art.

Hereinafter, circuit boards according to the present invention will now be described with reference to the accompanying drawings.

Figure 1:
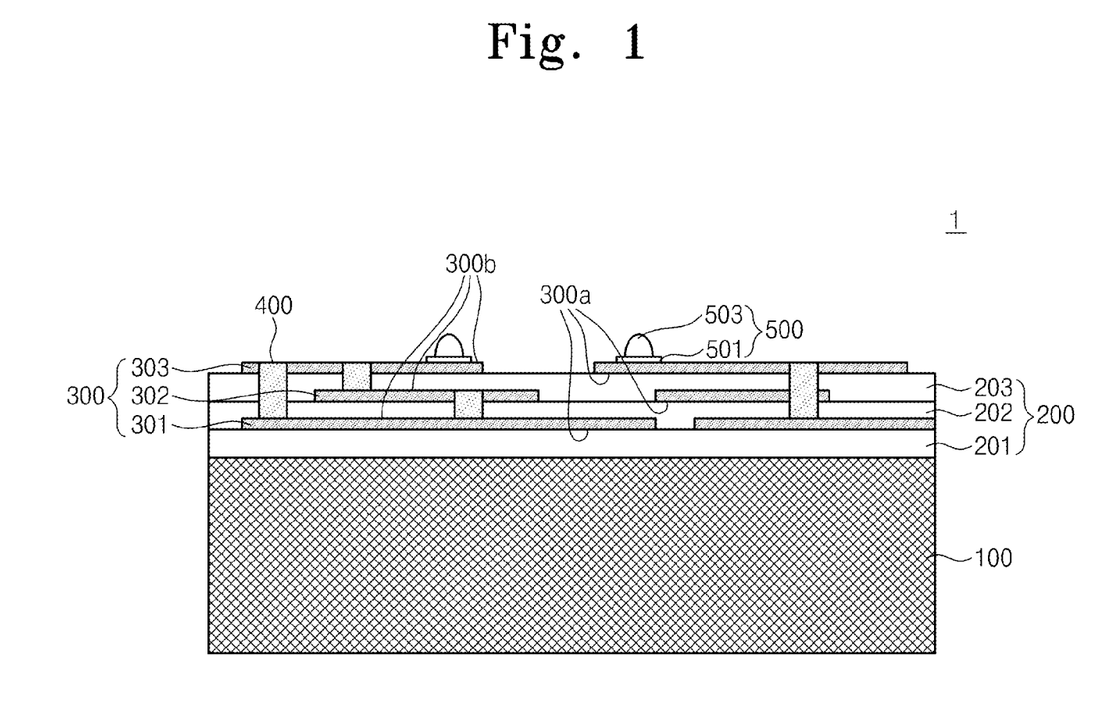
FIG. 1 is a cross-sectional view illustrating a circuit board according to an embodiment of the present invention.

FIG. 1 is a cross-sectional view illustrating a circuit board according to an embodiment of the present invention.

Referring to FIG. 1, a circuit board 1 may include a base layer 100, an adhesive film group 200, a conductive circuit group 300, and through vias 400. The through vias 400 may pass through the adhesive film group 200 and/or the conductive circuit group 300. The conductive circuit group 300 may include a first conductive circuit 301, a second conductive circuit 302, and/or a third conductive circuit 303. The first conductive circuit 301, the second conductive circuit 302, and/or the third conductive circuit 303 may have different functions and be connected to one another by the through via 400. Accordingly, the circuit board 1 may have multi functions.

The base layer 100 may include a polymer material or a fabric. Fabrics may include a woven fabric, a knitted fabric, a nonwoven fabric, and a fibrous web. For example, the base layer 100 may include at least one of a synthetic fiber, a regenerated fiber, and/or a natural fiber. Even in the case that the circuit board 1 is folded or bent, the base layer 100, which is flexible, is not damaged.

The adhesive film group 200 may include at least one of an acrylic-based material, a urethane-based material, a polyester-based material, and a polyimide varnish-based material. The adhesive film group 200 may include the same material as that of the base layer 100. For example, when the base layer 100 is formed of a polyester-based fabric, the adhesive film group 200 provided on the base layer 100 may be formed of a polyester-based material. The adhesive film group 200 functions as an insulating layer to prevent electrical short circuiting between the first and second conductive circuits 301 and 302 and electrical short circuiting between the second and third conductive circuits 302 and 303. A first adhesive film 201 may have a thickness that is about half the thickness of the base layer 100. If the first adhesive film 201 is significantly thin, adhesive strength thereof may be decreased. If the first adhesive film 201 is significantly thick, an adhesive material included in the adhesive film group 200 may ooze out to a lower surface 100a of the base layer 100. The first adhesive film 201 may be disposed between the base layer 100 and the first conductive circuit 301. The second adhesive film 202 may be disposed between the first and second conductive circuits 301 and 302. The third adhesive film 203 may be disposed between the second and third conductive circuits 302 and 303.

The conductive circuit group 300 may have a printed circuit pattern. The conductive circuit group 300 as a stacked structure may have different patterns to perform different functions. The conductive circuit group 300 may include at least one of carbon, silver, gold, platinum, palladium, copper, aluminum, stanuum, iron, and nickel. Each of the first conductive circuit 301, the second conductive circuit 302, and/or the third conductive circuit 303 may have a thickness ranging from about 10 μm to about 100 μm. If the first conductive circuit 301, the second conductive circuit 302, and/or the third conductive circuit 303 are significantly thin, adhesive strength thereof to the adhesive film group 200 may be decreased. If the first conductive circuit 301, the second conductive circuit 302, and/or the third conductive circuit 303 are significantly thick, flexural rigidity thereof is decreased to thereby increase the occurrence of cracks of the first conductive circuit 301, the second conductive circuit 302, and/or the third conductive circuit 303. Each of the first conductive circuit 301, the second conductive circuit 302, and/or the third conductive circuit 303 may have a first surface 300a and a second surface 300b opposed to the first surface 300a. The first surface 300a is oriented to the base layer 100 and may be rougher than the second surface 300b. The first surface 300a of the first conductive circuit 301 contacts the first adhesive film 201. The first conductive circuit 301 may be disposed between the first and second adhesive films 201 and 202. The second conductive circuit 302 may be disposed between the second and third adhesive films 202 and 203. The third conductive circuit 303 may be disposed on the third adhesive film 203.

The through via 400 may include a conductive material such as W, Ti, Ni, Cu, Au, Ti/Cu, Ti/Ni, and/or an alloy thereof. The through vias 400 contact at least two of the first to third conductive circuits 301, 302, and 330. If necessary, the through vias 400 may selectively connect the first conductive circuit 301, the second conductive circuit 302, and/or the third conductive circuit 303 to one another. The through vias 400 may not pass through the first adhesive film 201 and the first conductive circuit 301. The through vias 400 may decrease the entire size of the circuit board 1 (e.g., the height thereof) and increase a signal speed.

External connection terminals 500 may be disposed on the third conductive circuit 303. The external connection terminals 500 may electrically connect the conductive circuit group 300 to an external electric device (such as an electronic element). The external connection terminal 500 may include a pad 501 and/or a solder ball 503. The external connection terminal 500 may include a conductive material. For example, the external connection terminals 500 may be spaced apart from the through vias 400. For another example, the external connection terminals 500 may contact the through vias 400.

Thicknesses of the conductive circuit group 300 may be adjusted to protect the conductive circuit group 300 from folding or bending of the base layer 100. Thus, the conductive circuit group 300 of the circuit board 1 can be designed regardless of folding of the base layer 100. Accordingly, the circuit board 1 having a multi-layered structure can function not only as a fabric or clothes but also as an electronic circuit.

Hereinafter, a method of fabricating a circuit board according to an embodiment of the present invention will now be described.

FIGS. 2 to 12 are cross-sectional views illustrating a method of fabricating a circuit board according to an embodiment of the present invention. Hereinafter, a description of the same part as that of the above description will be omitted.

Figure 2:
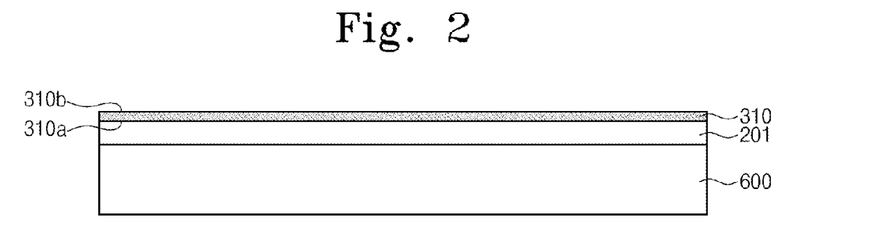
FIGS. 2 to 12 are cross-sectional views illustrating a method of fabricating a circuit board according to an embodiment of the present invention.

Referring to FIG. 2, the first adhesive film 201 and a conductive film 310 may be sequentially stacked on a protective film 600. The protective film 600 may be used to form the first adhesive film 201 and the first conductive circuit 301 to be transferred to the base layer 100 (refer to FIG. 1). For example, a polymer film including at least one of polyester (PET), polycarbonate (PC), and polyphenylene sulfide (PPS) may be used as the protective film 600. For another example, metal foil such as SUS (stainless steel according to Japanese Industrial Standards), copper foil, nickel foil, and/or aluminum foil may be used as the protective film 600.

Each of the first adhesive film 201 and the conductive film 310 may be formed through a laminating process. The laminating process may be performed at a temperature ranging from about 90 to 110° C., a pressure ranging from about 1.8 to 2.2 kg/cm$^2$, and a speed ranging from about 1 to 1.5 m/min. Process conditions of the laminating process may vary depending on used facilities and/or the type of the first adhesive film 201. The first adhesive film 201 may be formed of an acrylic-based material, a urethane-based material, a polyester-based material, and/or a polyimide varnish-based material. The conductive film 310 may be disposed on the first adhesive film 201. The conductive film 310 may have a first surface 310a and a second surface 310b opposed to the first surface 310a. The first surface 310a of the conductive film 310 may be rougher than the second surface 310b and contact the first adhesive film 201. The conductive film 310 may be formed of a conductive material such as carbon, silver, gold, platinum, palladium, copper, aluminum, stanuum, iron, and/or nickel.

Figure 3:
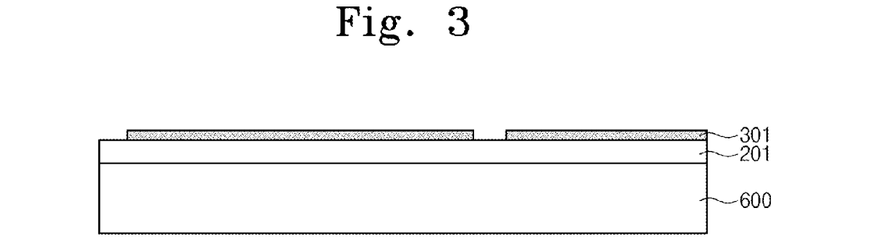

Referring to FIG. 3, the first conductive circuit 301 may be formed by patterning the conductive film 310 through an exposure process and an etch process. The first conductive circuit 301 may have various patterns. The etch process may have etch selectivity of the first adhesive film 201. The first adhesive film 201 may function as an etch stop layer. An etch solution may be injected at a pressure lower than that of a typical printed circuit board process to prevent the etch solution from being introduced into an interface between the first adhesive film 201 and the first conductive circuit 301. While the conductive film 310 is formed as described with reference to FIG. 2, the process conditions of the laminating process may be set to prevent air bubbles from being formed in the interface between the first adhesive film 201 and the first conductive circuit 301, thereby preventing the introduction of the etch solution.

Figure 4:
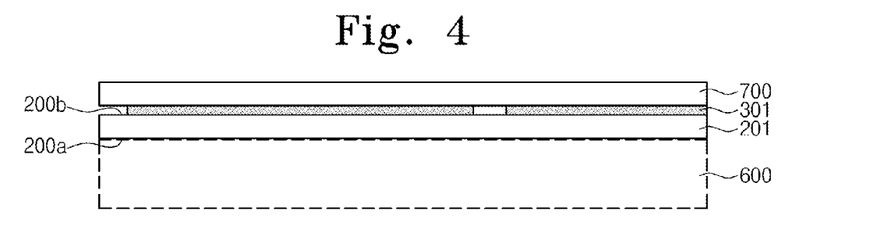

Referring to FIG. 4, a carrier film 700 may be formed on the first conductive circuit 301 through a laminating process. For example, the laminating process may be performed at room temperature, a pressure of about 1 kg/cm$^2$, and a speed of about 1 m/min. The carrier film 700 may be formed such that a foreign substance is prevented from being introduced into an interface between the first conductive circuit 301 and the carrier film 700, or a wrinkle is prevented from being formed on the carrier film 700. The carrier film 700 may maintain the patterns of the first conductive circuit 301. The first adhesive film 201 may have an upper surface 200b and a lower surface 200a opposed to the upper surface 200b. The protective film 600 may be removed to expose the lower surface 200a of the first adhesive film 201.

Figure 5:
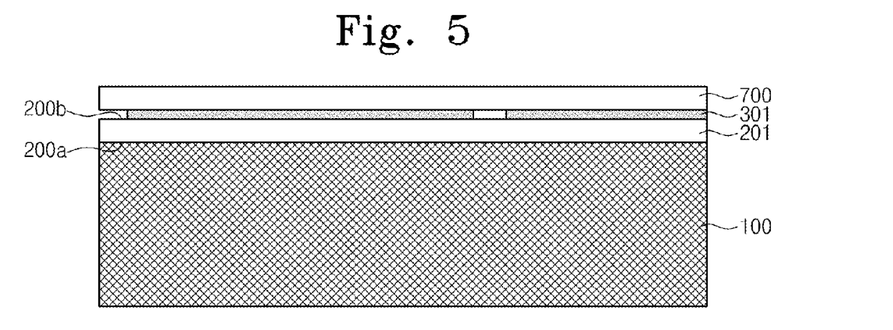

Referring to FIG. 5, the first adhesive film 201 and the first conductive circuit 301 may be transferred to the base layer 100 through a hot-pressing process. To this end, the first adhesive film 201, the first conductive circuit 301, and the carrier film 700 may be primarily hot-pressed for about 15 to 20 minutes at a temperature ranging from about 90 to 110° C. and a pressure ranging from about 13 to 16 kg/cm$^2$, then be secondarily hot-pressed for about 40 to 50 minutes at a temperature ranging from about 150 to 170° C. and a pressure ranging from about 18 to 22 kg/cm$^2$, and then be cooled. At this point, the lower surface 200a of the first adhesive film 201 may be exposed and be oriented to the base layer 100. The base layer 100 may include at least one of fabrics such as a synthetic fiber, a regenerated fiber, and a natural fiber. The base layer 100 may include a material similar to that of the first adhesive film 201. For example, the first adhesive film 201 formed of a polyester-based material may be transferred to the base layer 100 formed of a polyester-based fabric.

Figure 6:
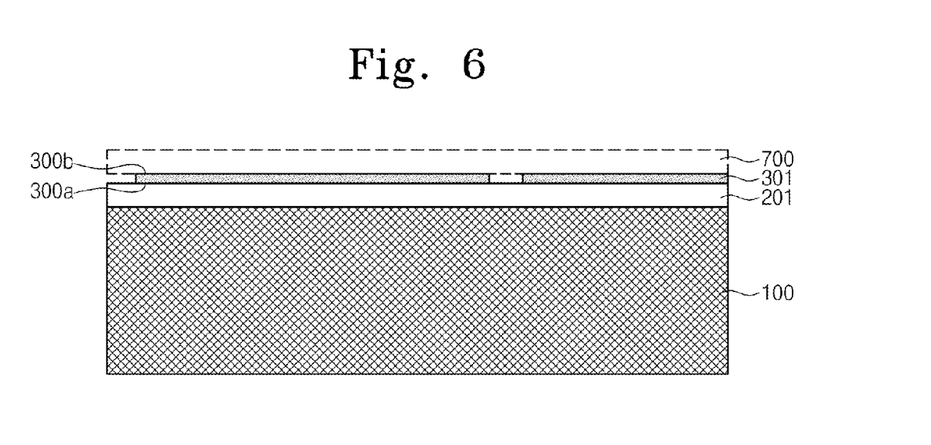

Referring to FIG. 6, the carrier film 700 may be removed from the first conductive circuit 301. Since the first surface 300a of the first conductive circuit 301 is rougher than the second surface 300b, the adhesive strength between the first conductive circuit 301 and the first adhesive film 201 may be greater than the adhesive strength between the first conductive circuit 301 and the carrier film 700. Thus, the carrier film 700 can be easily removed from the first conductive circuit 301.

Figure 7:
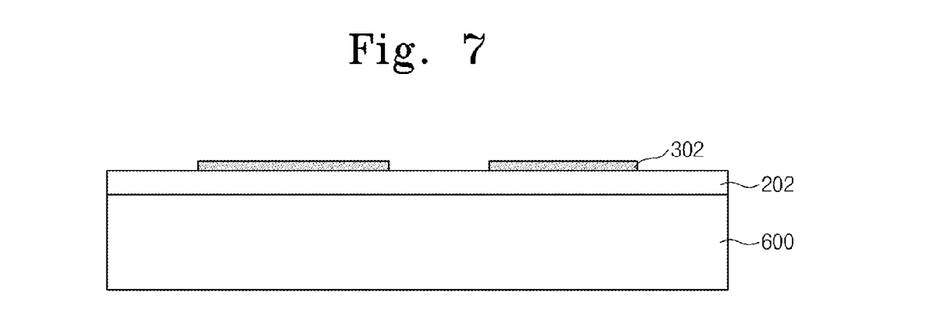

Referring to FIG. 7, the second adhesive film 202 and the second conductive circuit 302 may be sequentially stacked on the protective film 600. To this end, a method as illustrated in FIGS. 2 and 3 may be used.

Figure 8:
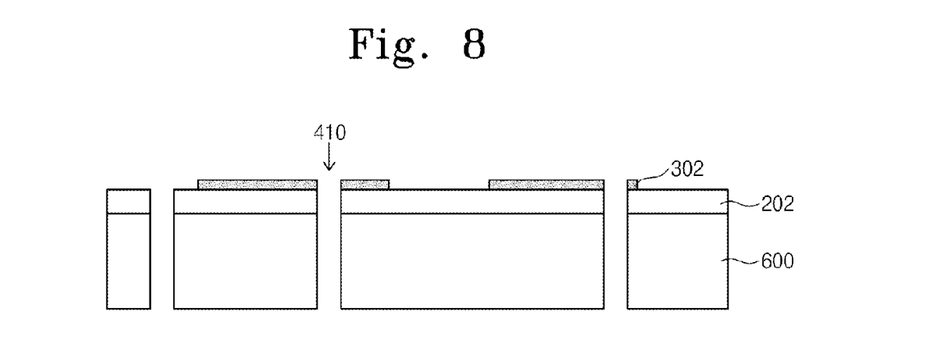

Referring to FIG. 8, through holes 410 may pass through the protective film 600, the second adhesive film 202, or the second conductive circuit 302. The through holes 410 may be formed through drilling. The positions of the through holes 410 may be varied.

Figure 9:
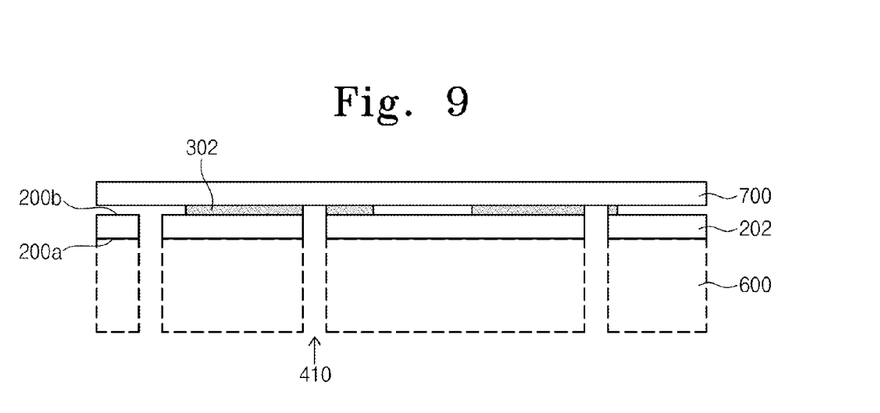

Referring to FIG. 9, the carrier film 700 may be formed on the second conductive circuit 302. The upper surface 200b of the second adhesive film 202 may contact the second conductive circuit 302, and be opposed to the lower surface 200a. The carrier film 700 may be formed before the through holes 410 are formed. In this case, the through holes 410 may pass through the carrier film 700. The protective film 600 may be removed to expose the lower surface 200a of the second adhesive film 202. To this end, a method as illustrated in FIG. 4 may be used.

Figure 10:
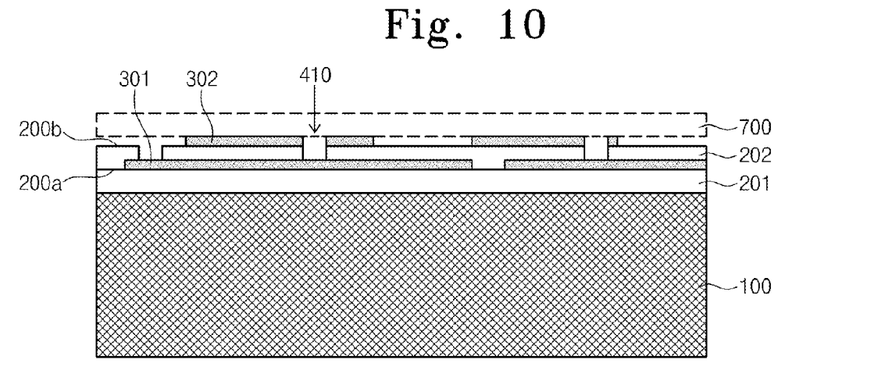

Referring to FIG. 10, the second adhesive film 202 and the second conductive circuit 302 may be transferred to the base layer 100 through a hot-pressing process. The transferring may be performed such that the second adhesive film 202 contacts the first conductive circuit 301. At this point, the lower surface 200a of the second adhesive film 202 may be exposed and oriented to the base layer 100. After that, the carrier film 700 may be removed from the second conductive circuit 302. The transferring of the second adhesive film 202 and the second conductive circuit 302 and the removing of the carrier film 700 may be performed using methods as illustrated in FIGS. 5 and 6.

Figure 11:
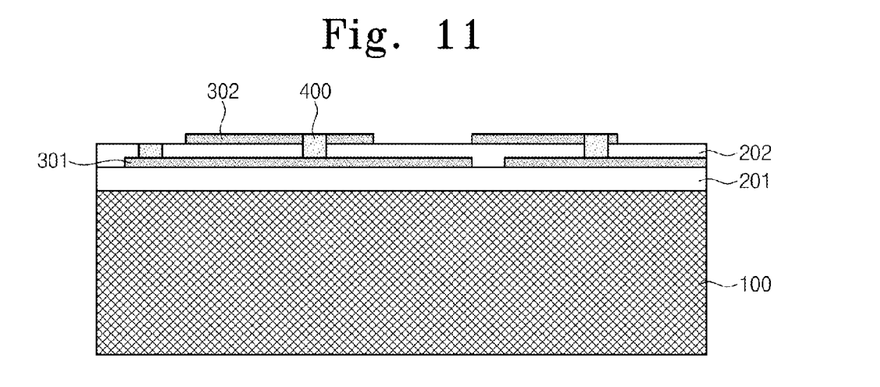

Referring to FIG. 11, the through holes 410 may be filled to form the through vias 400.

The through vias 400 may be formed through filling, soldering, or a combination thereof. For example, the through holes 410 may be filled with an adhesive. For another example, the soldering may be performed at a temperature of about 200° C. The base layer 100 may resist the temperature of about 200° C. For another example, the soldering may be performed at a temperature of about 350° C. The first adhesive film 201 may prevent heat transfer to the base layer 100 to protect the base layer 100. Since the soldering can be performed under various temperature conditions, the through holes 410 can be filled with various conductive materials. For example, the through holes 410 may be filled with W, Ti, Ni, Cu, Au, Ti/Cu, Ti/Ni, and/or an alloy thereof. The through vias 400 may electrically connect the first and second conductive circuits 301 and 302.

Figure 12:
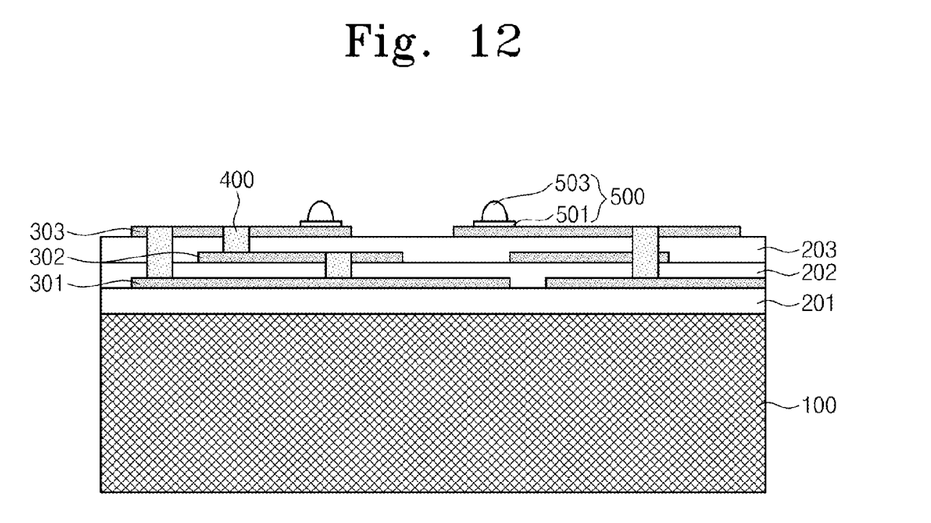

Referring to FIG. 12, the third adhesive film 203 and the third conductive circuit 303, which include the through vias 400, may be sequentially formed on the base layer 100. To this end, methods as illustrated in FIGS. 7 to 11 may be used. At this point, the third conductive circuit 303 may have a pattern different from those of the first conductive circuit 301 and/or the second conductive circuit 302.

Referring again to FIG. 1, the external connection terminals 500 may be formed on the third conductive circuit 303. The external connection terminals 500 may be formed of a conductive material. The external connection terminal 500 may be fabricated by forming the pad 501 and forming a solder ball 502 on the pad 501 through a lithography process, an etch process, and a reflow process. Accordingly, the fabrication of the circuit board 1 may be completed.

Hereinafter, a semiconductor package including a circuit board and a method of fabricating the semiconductor package will now be described according to an embodiment of the present invention.

Figure 13:
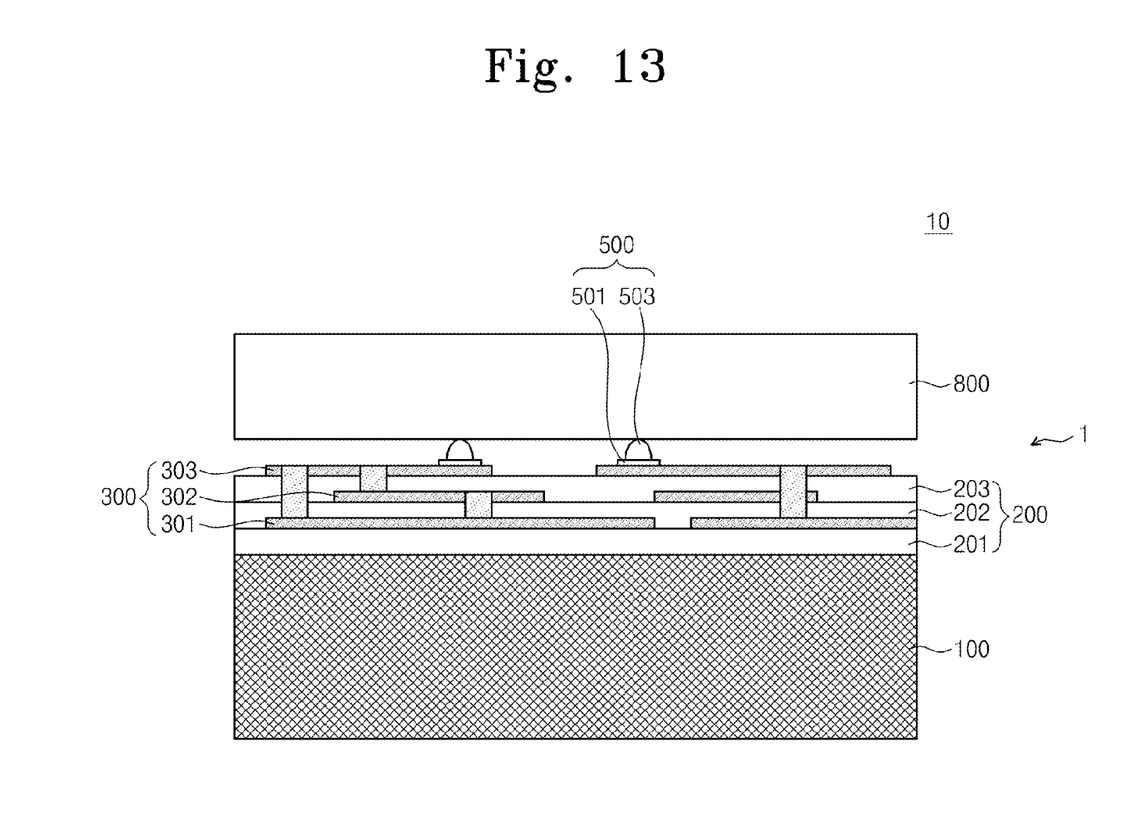
FIG. 13 is a cross-sectional view illustrating a semiconductor package including a circuit board and a method of fabricating the semiconductor package, according to an embodiment of the present invention.

FIG. 13 is a cross-sectional view illustrating an electronic device mounted on a circuit board according to an embodiment of the present invention.

Referring again to FIG. 13, an electronic device 800 may be mounted on the circuit board 1.

The circuit board 1 as illustrated in FIG. 1 may be fabricated using methods as illustrated in FIGS. 2 to 12. The electronic device 800 may include a passive device, an active device, and/or a highly integrated circuit. The external connection terminals 500 may electrically connect the conductive circuit group 300 to the electronic device 800. Accordingly, the fabrication of a semiconductor package 10 including the circuit board 1 may be completed.

According to an embodiment of the present invention, a circuit board may include adhesive films having a multi-layered structure and conductive circuits having a multi-layered structure, which are stacked on a flexible base layer. Through vias may connect conductive circuits having different functions to one another. Accordingly, the circuit board may have multi functions. Thicknesses of the conductive circuits may be adjusted to protect the conductive circuits from folding or bending of the base layer. The conductive circuits of the circuit board can be designed regardless of folding of the base layer. Accordingly, the circuit board having a multi-layered structure can function not only as a fabric or clothes but also as an electronic circuit.

According to an embodiment of the present invention, the through vias may be formed of various conductive materials by using a method of fabricating a circuit board. The conductive circuits may have various patterns.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A circuit board comprising:
a base layer;
a first adhesive film on the base layer;
a first conductive circuit on the first adhesive film;
a second adhesive film and a second conductive circuit, which are sequentially stacked on the first conductive circuit; and
a through via passing through the second adhesive film and the second conductive circuit and spaced apart from the base layer,
wherein the first adhesive film comes in contact with the base layer and does not include any through via that passes through the first adhesive film.

2. The circuit board of claim 1, wherein the base layer comprises a polymer material or a fabric.

3. The circuit board of claim 1, further comprising:
a third adhesive film on the second conductive circuit;
a third conductive circuit on the third adhesive film; and
an external connection terminal on the third conductive circuit.

4. The circuit board of claim 1, wherein the second conductive circuit comprises a first surface oriented to the base layer and a second surface opposed to the first surface, and the first surface is rougher than the second surface.

5. The circuit board of claim 1, further comprising:
a pad on the second conductive circuit; and
a solder ball on the pad.

6. The circuit board of claim 1, wherein the first adhesive film comprises an acrylic-based material, an urethane-based material, a polyester-based material, or a polyimide varnish-based material, and
the base layer comprises a polymer material based on the same material as that of the first adhesive film.

7. The circuit board of claim 1, wherein the base layer does not include any through via that passes through the base layer.

8. A method of fabricating a circuit board, comprising:
providing a first adhesive film and a first conductive circuit, which are sequentially stacked on a protective film and have a through hole;
transferring the first adhesive film and the first conductive circuit onto a base layer to sequentially stack the first adhesive film and the first conductive circuit thereon; and
forming a through via filling the through hole;
wherein the providing of the first adhesive film and the first conductive circuit comprises:
forming the through hole passing through the protective film, the first adhesive film, and the first conductive circuit; and
exposing the first adhesive film by forming a carrier film on the first conductive circuit and removing the protective film,
wherein the forming of the through via comprises:
removing the carrier film to expose the through hole; and
filling the through hole.

9. The method of claim 8, wherein the providing of the first adhesive film and the first conductive circuit comprises:
sequentially forming the first adhesive film and a conductive film on the protective film; and
patterning the conductive film to form the first conductive circuit.

10. The method of claim 8, further comprising:
sequentially forming a third adhesive film and a third conductive circuit on the first conductive circuit; and
forming a pad and a solder ball on the third conductive circuit.

11. The method of claim 8, wherein the base layer further includes a second adhesive film and a second conductive circuit which are sequentially formed on the base layer.

12. The method of claim 8, wherein the through hole is filled with a conductive material.

13. The method of claim 8, further comprising, after the forming of the through via, forming a pad or a solder ball on the first conductive circuit to electrically connect the first conductive circuit to an external device.

14. The method of claim 8, wherein the sequentially stacking of the first adhesive film and the first conductive circuit comprises disposing the first adhesive film to be oriented to the base layer and hot-pressing the first adhesive film.

15. The method of claim 8, wherein the base layer comprises a polymer material or a fabric.

16. A semiconductor package comprising:
a base layer;
a first adhesive film and a first conductive circuit, which are stacked on the base layer;
a second adhesive film and a second conductive circuit, which are stacked on the first conductive circuit;
a through via passing through the second adhesive film and the second conductive circuit, wherein the first adhesive film comes in contact with the base layer and does not include any through via that passes through the first adhesive film;
an external connection terminal on the second conductive circuit; and
an electronic device mounted on the second conductive circuit.

17. The semiconductor package of claim 16, wherein the second adhesive film comprises an insulating material and prevents short circuiting between the first conductive circuit and the second conductive circuit.

18. The semiconductor package of claim 16, wherein the base layer comprises a polymer material or a fabric.

19. The semiconductor package of claim 16, further comprising a third adhesive film and a third conductive circuit, which are stacked between the second conductive circuit and the external connection terminal.

20. The semiconductor package of claim 16, wherein the base layer does not include any through via that passes through the base layer.

* * * * *